United States Patent [19]

Suzuki et al.

[11] Patent Number: 4,901,667
[45] Date of Patent: Feb. 20, 1990

[54] SURFACE TREATMENT APPARATUS

[75] Inventors: Keizo Suzuki, Kodaira; Ken Ninomiya, Hachioji; Shigeru Nishimatsu, Kokubunji; Osami Okada, Chofu, all of Japan

[73] Assignee: Hitachi, Ltd., Tokyo, Japan

[21] Appl. No.: 891,641

[22] Filed: Aug. 1, 1986

[30] Foreign Application Priority Data

Aug. 9, 1985 [JP] Japan ............................. 60-174111

[51] Int. Cl.$^4$ ................................................ C23C 16/00
[52] U.S. Cl. .................................... 118/719; 118/715; 118/724; 156/345
[58] Field of Search ..................... 118/715, 724, 719; 156/345

[56] References Cited

U.S. PATENT DOCUMENTS

| | | | |
|---|---|---|---|
| 2,551,389 | 5/1951 | Oliver | 118/733 |
| 3,517,643 | 6/1970 | Goldstein | 118/715 |
| 3,785,853 | 1/1974 | Kirkman | 118/719 |
| 3,854,443 | 12/1974 | Baerg | 118/730 |
| 4,051,382 | 9/1977 | Ogawa | 204/164 |
| 4,434,742 | 3/1984 | Hentaff | 118/723 |
| 4,461,783 | 7/1984 | Yamazaki | 118/723 |
| 4,468,283 | 8/1984 | Ahmed | 118/724 |
| 4,522,674 | 6/1985 | Ninomiya | 118/724 |
| 4,526,805 | 7/1985 | Yoshizawa | 118/723 |

FOREIGN PATENT DOCUMENTS 2141386 12/1984 United Kingdom .

*Primary Examiner*—Richard Bueker
*Attorney, Agent, or Firm*—Antonelli, Terry & Wands

[57] ABSTRACT

A surface treatment apparatus comprising a vacuum chamber, means for introducing a gas into the vacuum chamber, a gas furnace for heating and activating the gas while it is being introduced, apertures for injecting the heated gas, and a substrate stage for holding a substrate of which the surface is to be treated by the injected gas. The gas that is heated and activated is blown onto the surface of the substrate to treat the surface without causing the surface to be damaged. Therefore, the apparatus can be employed very effectively for a process for producing semiconductor elements.

17 Claims, 5 Drawing Sheets

SURFACE TREATMENT APPARATUS

BACKGROUND OF THE INVENTION

The present invention relates to an appratus for treating solid surfaces, and more particularly to a surface treatment apparatus which is capable of realizing a process adapted to the manufacture of semiconductor elements giving neither damage nor contamination, and maintaining high selectivity at low-temperature conditions.

Conventional dry processes for the manufacture of semiconductor elements employ an ion beam or a plasma (Edited by Takuo Sugano; "Application of Plasma Processes to VLSI Technology", JOHN WILEY and SONS, 1985, pp. 1-3). According to such processes, however, ions, atoms, molecules and electrons of large kinetic energy (greater than about 100 eV) fall on an element to be treated, on the surface of a substrate, or on the solid surface near the element, such as on the inner wall of a vacuum chamber or on the surface of a substrate stage, causing the surface of the element to be damaged and contaminated unavoidably.

Moreover, particles having high energy that fall on the substrate causes its temperature to rise. Damage, contamination and temperature rise of the elements become serious problems as the semiconductor elements are produced in small sizes (1 $\mu$m or smaller). Such problems of damage, contamination and temperature rise will be serious in the semiconductor elements of the three-dimensional structure that are expected to be realized in the near future, and the conventional dry processes can no longer be put into practice.

SUMMARY OF THE INVENTION

The object of the present invention is to provide a surface treatment apparatus which is capable of treating the surfaces while preventing the substrate from being damaged, contaminated or heated at high temperatures.

Namely, the present invention provides a surface treatment apparatus in which a gas is heated to form active particles, the active particles are injected into vacuum to form a beam of active particles, and the surface of a substrate is treated by the beam. Here, the word "beam" refers to a mass of particles in which the velocity distribution of particles is not isotropic (i.e., in which particles flow in a predetermined direction as a whole). In the apparatus of the present invention which employs neither the ion beam nor the plasma, the energy of incident particles is very small (1 eV or smaller) and the surface of the substrate is not damaged. Moreover, since the substance near the substrate is not sputtered, the surface is not contaminated, either. Moreover, the incident particles having low energy cannot raise the temperature on the surface of the substrate so high, and the process can be carried out at low temperatures.

DETAILED DESCRIPTION OF THE PREFERRED EMBODIMENTS

The invention will now be described in detail in conjunction with the drawings.

Figure 1:
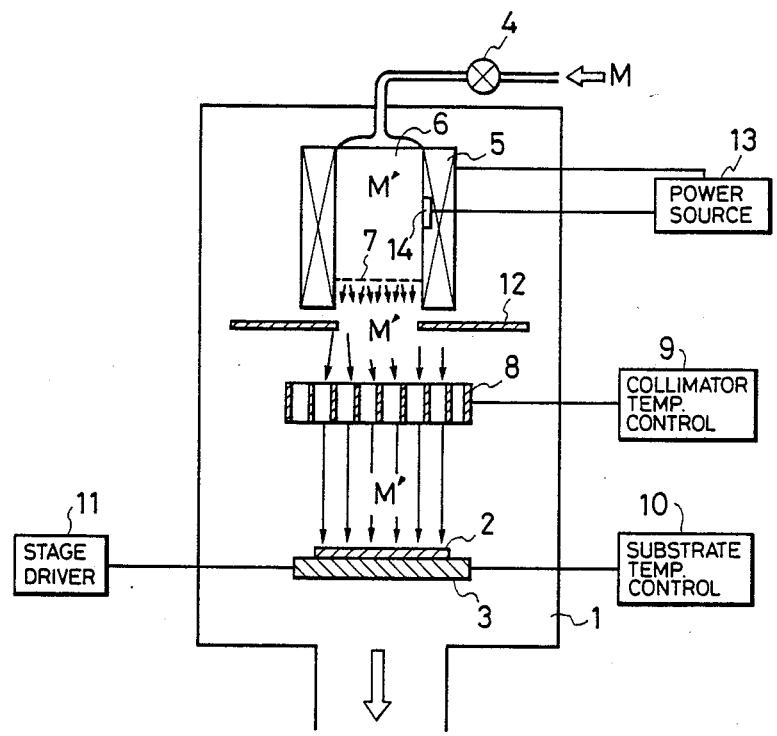
FIG. 1 is a diagram illustrating the structure of a surface treatment apparatus according to an embodiment of the present invention.

FIG. 1 illustrates a surface treatment apparatus according to an embodiment of the present invention. The apparatus of this embodiment comprises a vacuum chamber 1, a substrate stage 3 for holding a substrate 2, a leak valve 4 for introducing a gas, gas heating means which consists of a heater 5 and a furnace 6, and apertures 7 for injecting the gas into the vacuum chamber. There are further provided a collimator 8 for arranging the directivity of gaseous particles that are injected, temperature control means 9 for the collimator 8, temperature control means 10 for the substrate, substrate stage drive means 11, and a shielding plate 12. Further, a power source 13 for the heater is provided with a feedback function to maintain a constant temperature of the gas by using signals from temperature measuring means 14.

The gas (M represents atoms or molecules constituting the gas) introduced through the leak valve 4 is heated by the gas heating means which consists of the heater 5 and the furnace 6. The gas that is introduced is heated to form active particles (M'). For example, an $F_2$ gas is decomposed by the heat to form active radicals F. If expressed by the reaction formula, the following thermal decomposition is effected, $$F_2 \rightarrow 2F \qquad (1)$$

The same also holds true for other halogen molecules ($Cl_2$, $Br_2$, $I_2$, and the like). If a halogen atom is denoted by R, in general, active radicals R can be easily formed by the thermal decomposition, i.e., $$R_2 \rightarrow 2R \qquad (2)$$

The temperature ($T_f$) of the furnace required for the thermal decomposition may differ depending upon the gas that is introduced. In the case of $F_2$ gas, the temperature must be higher than about 300° C. and in the case of $Cl_2$ gas, the temperature must be higher than about 500° C. The upper limit is determined by the resistance of the material of the furnace against the heat and against the chemical reaction, and may range up to about 1500° C.

When the introduced gaseous particles consist of molecules, furthermore, the inner freedom (freedom of rotational, vibrational and electronic motions) of molecules is excited by the heating, thereby to form active particles. Particularly, the molecules of which the moledular vibration is excited, are called hot molecules that remain chemically active. For example, if $SF_6$ molecules of which the freedom of molecular vibration is excited, are denoted by $SF_6^*$, there takes place a reaction between the $SF_6^*$ molecules and the silicon substrate as expressed by the following reaction formula, $$2SF_6^* + Si \rightarrow SiF_4(gas) + 2SF_4 \qquad (3)$$

to etch the silicon substrate (T. J. Chuang, J. Chem. Phys., 74, 1453 (1981)). To efficiently form the $SF_6^*$ molecules, the temperature of the furnace must be higher than 500° C. In addition to the $SF_6$ gas, $NF_3$ gas also exhibits the same effects. That is, the $NF_3$ molecules ($NF_3^*$) of which the freedom of molecular vibration is excited, react with the silicon substrate to etch it. To form the $NF_3^*$ molecules, the temperature of the furnace must be higher than 300° C. Hot $O_2$ molecules ($O_2^*$) can also be formed by heating the $O_2$ molecules. The $O_2^*$ molecules react with the solid surface to effectively oxidize the surface. To form the $O_2^*$ molecules, the temperature of the furnace must be higher than 500° C.

The active particles formed in the furnace are injected through the apertures 7 into the vacuum chamber 1 so to flow (to form a beam of active particles) in one direction (mainly in a direction perpendicular to the surface in which apertures are formed). Here, however, the velocity distribution of particles is not perfectly oriented in one direction but is largely oriented in one direction, permitting the particles to flow non-uniformly.

The active particles that fall on the surface of the substrate undergo a variety of chemical reactions with the surface of the substrate thereby to treat the surface. For instance, halogen atom radicals generated according to the equation (2) undergo the reaction with such substrates as Si, $SiO_2$, $Si_3N_4$, Mo, W, Al, and the like to etch them. The silicon substrate of a single crystal may be employed, or a polycrystalline silicon substrate may be employed. Or, the substrate may be composed of a silicide such as Si-Mo or Si-W. Further, hot molecules such as of $SF_6^*$ and $NF_3^*$ react with such substrates as Si, Mo and W to etch them. The substrate may be composed of a single crystal, a polycrystal, or a silicide. Moreover, hot molecules such as $O_2^*$ react with the surface of the substrate to oxidize it. Though there is no particular limitation with regard to the material of the substrate, silicon is used in a semiconductor process. Further, hot molecules such as $N_2^*$ react with the surface of the substrate to nitrify it. This can be applied to increase the hardness of the surface of metals such as nickel, titanium, and the like.

Examples of the heater include electric resistance heating, heating by an infrared ray lamp, and RF heating. Among them, the electric resistance heating can be easily put into practice.

In order for the gas to be sufficiently heated in the furnace, the volume of the furnace must be greater than a given value. Empirically, a desirable volume V (cm$^3$) of the furnace is, $$V \geq 10^{-3} \times Q$$

where Q (sccm) denotes the flow rate of gas.

The apertures 7 may have a circular shape, a square shape or any other shape. The circular shape, however, is easy to form. If the apertures are too small, the gas is not allowed to flow sufficiently. If the apertures are too large, the pressure in the vacuum chamber becomes too high. Empirically, the apertures having a diameter d of from 0.1 to 10 mm are desirable.

If the side walls forming the apertures have a temperature lower than the temperature of the gas, the gas may be cooled while it passes through the apertures. In this case, the hot molecules are not hot molecules anymore, and lose chemical reactivity. This, however, can be effectively prevented if the apertures 7 are formed inside the heater 5 as shown in FIG. 1. In practice, the apertures should be formed in the heater at a position away from the opening by a radius of the opening.

A suitable furnace material may differ depending upon the gas that is to be heated. For example, when a gas containing halogen atoms such as $F_2$, $Cl_2$, $SF_6$, or $NF_3$ is to be heated, a chemically stable material can be advantageously used, such as quartz, alumina, sapphire, or the like. In particular, quartz and alumina are cheap, easy to process and are industrially advantageous. Further, a halide of nickel is stable and can be used as a material of furnace.

If use is made of a material such as carbon (graphite or amorphous carbon) that easily reacts with halogen atoms, it is possible to remove halogen atoms relying upon the thermal decomposition. For instance, if the $SF_6$ gas is heated, F radicals are formed by the thermal decomposition as well as $SF_6^*$. When it is desired to treat the surface with $SF_6^*$ alone, the F radicals are not necessary. In such a case, if the above-mentioned carbon is used as the furnace material, the F radicals are removed by the reaction $C + 4F \rightarrow CF_4$. Thus, the surface can be treated by $SF_6^*$ alone.

To enhance the uniformity of the surface treatment, it is effective to move the substrate relative to the beam of active particles by substrate stage drive means 11. The rate of surface treatment can also be controlled by controlling the temperature of the substrate by substrate temperature control means 10.

The shielding plate 12 works to prevent the temperature on the surface of the substrate 2 from being raised by the radiation of heat from the heater 5 and from the furnace 6. The shielding plate 12 further works to prevent contaminating substances from flying from the heater 5 and the furnace 6 and from adhering on the surface of the substrate. A high-temperature portion and lead wire in the heater should be covered with a heat-resistant material (such as quartz or alumina), so that the contaminating substances will not fly and adhere onto the surface of the substrate as far as possible.

Figure 2A:
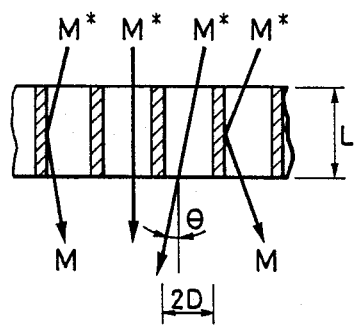
FIGS. 2A to 2C are section views illustrating the collimator functions.
Figure 2B:
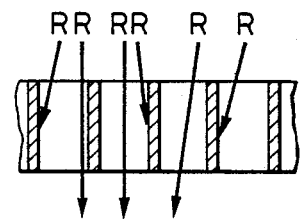

The collimator 8 is to improve the uniformity (directivity) in the velocity distribution of the beam of active particles. The collimator consists of a single or a plurality of holes that penetrate in parallel with an axis which connects the furnace to the surface of the substrate. Collimator temperature control means 9 controls the temperature of a side wall in which the holes are formed. When the active particles consist of hot molecules, the side wall of the collimator is cooled by collimator temperature control means 9. Then, as shown in FIG. 2A, as the hot molecules M* impinge upon the side wall of the collimator, the molecular vibration level assumes the ground state, and the hot molecules cool. Namely, only those hot molecules that have passed through the collimator without impinging upon the side wall remain hot molecules, and whereby the directivity of the beam of active particles is improved. If a divergent angle of the beam of active particles after having passed through the collimator is denoted by $\theta$, there exists a relation $\tan \theta = D/L$, where D denotes a radius of the hole and L denotes a thickness of the collimator. The cooling method may make use of water, liquid nitrogen or cooled helium gas. When the active particles consist of such radicals as F atoms, the side wall in which the holes are formed should be maintained at a sufficiently low temperature in order to improve the directivity of the beam of active particles. This is because, the radicals R that have impinged upon the side wall are adsorbed by the surface of the side wall and are not emitted any more (see FIG. 2B). When the above-mentioned method is employed, the collimator should be made of a material that remains chemically stable, such as quartz, aluminum, nickel, copper, or the like. In particular, aluminum, nickel and copper have good heat conductivity and can be cooled well.

Figure 2C:
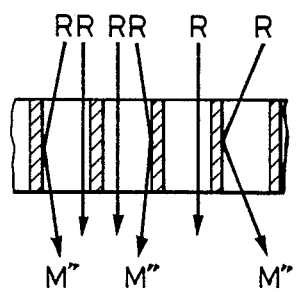

It is further possible to improve the directivity of the active parties by selecting a material that easily reacts with the active particles, as a material of the collimator (see FIG. 2C). For example, when the active particles consist of such radicals as F atoms, molybdenum can be selected as a material of collimator. Upon impingement on the side wall, the F radicals react with molybdenum to form $MoF_3$ which is not chemically active. Therefore, only those particles that have passed through without impinging upon the side wall remain active, and whereby the directivity of the active particles is enhanced. To improve the reactivity between molybdenum and F radicals, it is advantageous to increase the temperature of the side wall of the collimator (to be higher than about 100° C.).

Figure 3A:
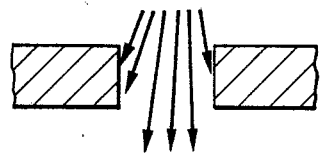
FIGS. 3A to 3E are section views illustrating the shapes of apertures.
Figure 3B:
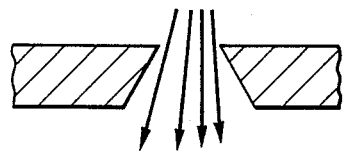
Figure 3C:
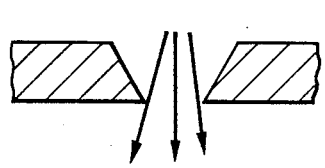
Figure 3D:
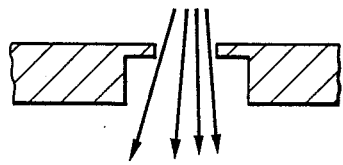
Figure 3E:
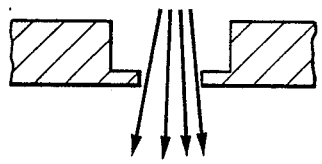

FIGS. 3A to 3E illustrate in cross section the shapes of apertures 7 for injecting the gas from the furnace. The aperture of FIG. 3A is easy to form and is practicable, but has the following disadvantage. That is, the active particles partly impinge upon the side wall of the aperture, react therewith, and are wasted. To prevent this, the thickness of the side wall must be decreased as small as possible. If the thickness is excessively decreased, however, the side wall loses mechanical strength; i.e., the plate in which the aperture 7 is formed, may be broken. To effectively decrease the thickness of the side wall of the aperture without breakage, it is recommended to change the size of the aperture between the side of the furnace and the side of the vacuum chamber as shown in FIGS. 3B to 3E.

Figure 4:
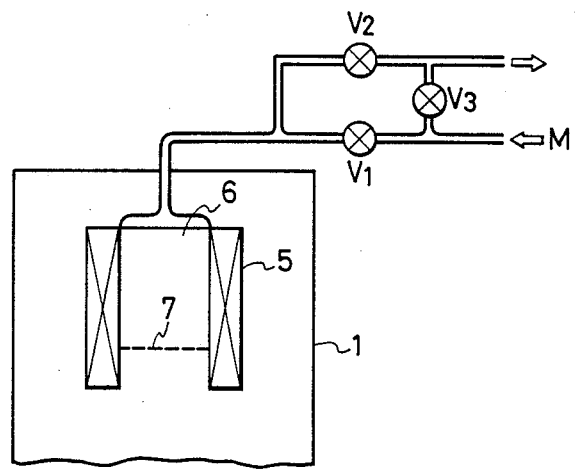
FIGS. 4 to 11 are diagrams illustrating the structures of the surface treatment apparatus or illustrating part of the structures of the surface treatment apparatus according to other embodiments of the present invention.

FIG. 4 illustrates a gas supply portion according to another embodiment of the present invention. The gas furnace 6 and the vacuum chamber 1 are communicated with each other through the apertures 7 only. Therefore, if the gas surface 6 is once filled with the gas, a tremendous period of time is required to remove the gas. It will become necessary to remove the gas, for example, when the supply gas M is to be replaced by another kind of gas. According to the structure shown in FIG. 4, the gas furnace 6 is exhausted through a valve $V_2$; i.e., by opening the valve $V_2$, the gas in the gas furnace 6 can be removed within short periods of time. This enables the gas to be replaced very easily. An exhaust line having the valve $V_2$ is called a by-pass exhaust line of the gas furnace 6. A valve $V_1$ is used to supply the gas from a gas tank into the gas furnace 6. A valve $V_3$ works to exhaust the gas that is supplied at a predetermined flow rate from the gas tank, in case when the valves $V_2$ and $V_1$ have been closed. The gas of the by-pass exhaust line via the valve $V_2$ may be exhausted through the vacuum chamber 1, or may be exhausted by a separate exhaust means.

Figure 5:
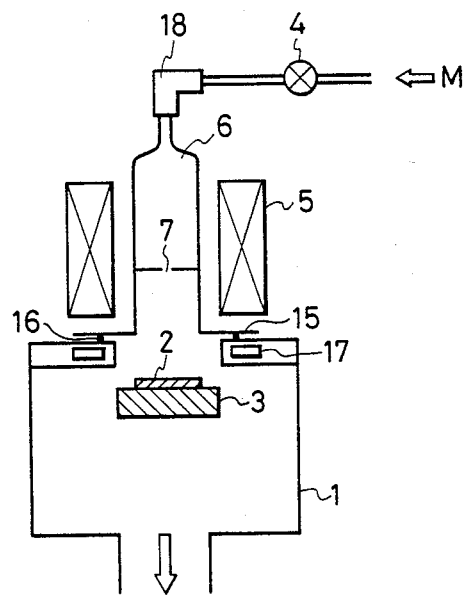

FIG. 5 illustrates a further embodiment according to the present invention. The feature of this embodiment resides in that the heater 5 is located outside the vacuum chamber 1. This makes it possible to prevent the radiation of heat from the heater 5 onto the surface of the substrate, or to prevent contaminating materials from flying onto the surface of the substrate. In this case, the heater should preferably be an infrared ray lamp. The outer wall of the gas furnace 6 is not placed under the vacuum condition, and a vacuum seal 16 is required between the gas furnace 6 and the vacuum chamber 1. A flange 15 prevents the vacuum seal from coming into direct contact with the gas furnace 6. Cooling means 17 works to prevent the vacuum seal from being broken down by the heat.

According to this embodiment, furthermore, the heater 5 can be separated from the gas furnace 6, making it easy to exchange the gas furnace 6 that is subject to be worn out and damaged. A coupling portion 18 makes it easy to exchange the gas furnace 6.

Figure 6:
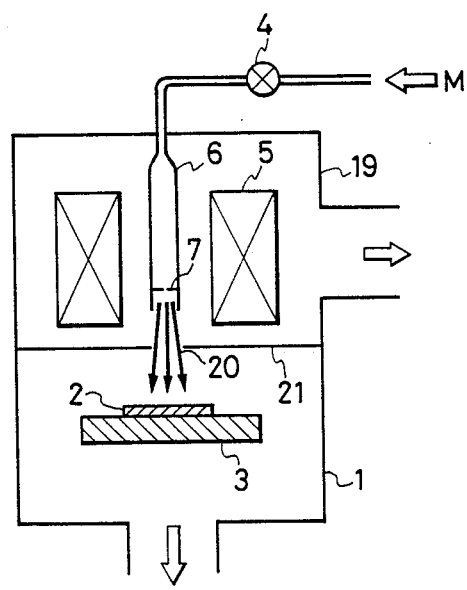

FIG. 6 shows a still further embodiment of the present invention. The feature of this embodiment resides in that gas heating means is installed in a vacuum chamber 19 which is different from the vacuum chamber 1 in which the substrate 2 is placed. The vacuum chamber 1 of the side of the substrate and the vacuum chamber 19 on the side of gas heating means are differentially exhausted via a partitioning plate 21 which has a small exhaust port 20. This embodiment prevents the radiation of heat from the heater onto the surface of the substrate, prevents contaminating materials from flying, and prevents the heater from being damaged by the open air.

Figure 7:
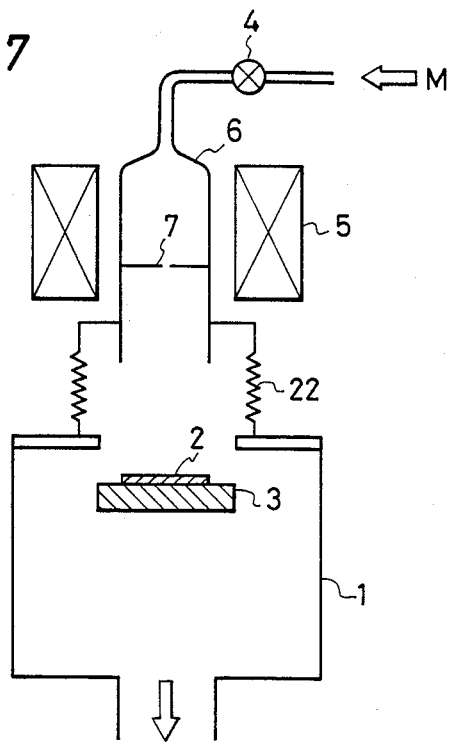

FIG. 7 illustrates another embodiment of the present invention. The feature of this embodiment resides in the provision of gas furnace moving means which consists of a bellows 22, such that a relative distance and a relative angle can be varied between the gas furnace 6 and the substrate 2. This enables the substrate to be effectively irradiated with the beam of active particles.

Figure 8:
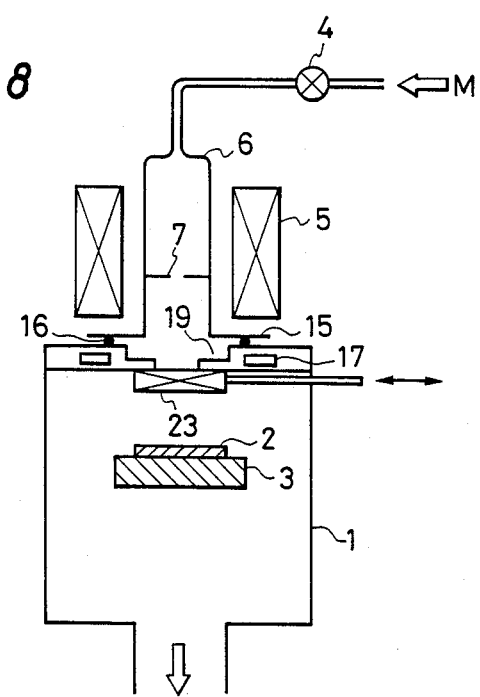

FIG. 8 illustrates a yet further embodiment of the present invention. The feature of this embodiment resides in the provision of a gate valve 23 between the gas furnace and the vacuum chamber 1. To exchange the substrate, the vacuum chamber 1 must be leaked to the atmospheric pressure or the pressure in the vacuum chamber 1 must be maintained high to some extent. However, to increase the pressure while maintaining the gas furnace 6 at a high temperature, is not desirable since the inner wall of the gas furnace reacts with the open air. On the other hand, to cool the gas furnace and to heat it again after each exchange of the substrate, prolongs the operation time and is not practical. The gate valve 23 according to this embodiment makes it possible to leak the vacuum chamber 1 of the substrate side only maintaining the vacuum chamber 19 in the gas furnace portion under a high vacuum condition. This enables the surface treatment to be carried out more efficiently.

Figure 9:
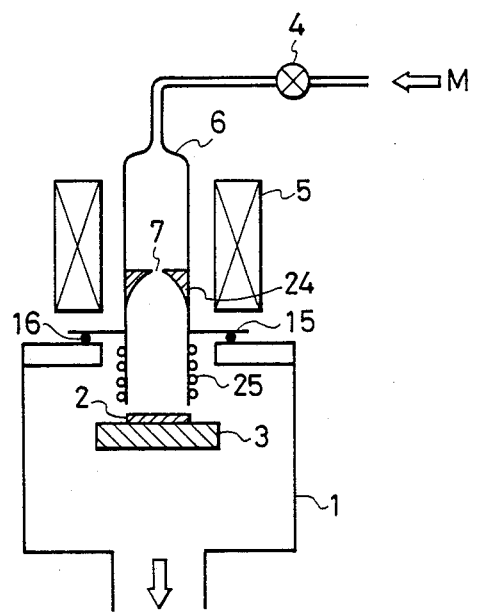

FIG. 9 illustrates a further embodiment of the present invention. The feature of this embodiment resides in the provision of an auxiliary pipe 24 so that the flow of gas injected through the aperture 7 will expand gradually. This helps improve the uniformity of the beam of active particles. Cooling means 25 prevents active particles and reaction products adhered onto the inner wall of the auxiliary pipe 24 from flying away. Therefore, the surface of the substrate is prevented from being contaminated.

Figure 10:
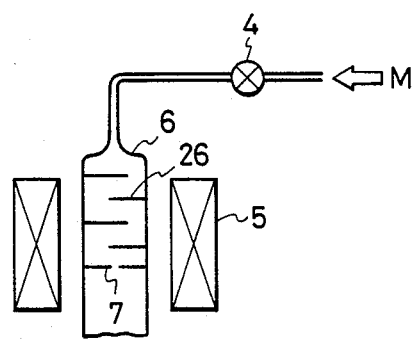
Figure 11:
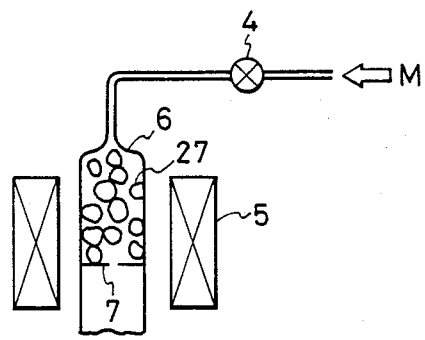

FIGS. 10 and 11 illustrate other embodiments of the present invention. The feature of these embodiments resides in that a barrier wall 26 is provided in the gas furnace 6 as shown in FIG. 10 or a filler 27 is provided in the gas furnace 6 as shown in FIG. 11. Namely, areas of the walls of the gas furnace 6 are substantially increased so that the gas can be heated easily. This method produces a beam of active particles of a high temperature maintaining a large flow rate.

The present invention makes it possible to treat the surfaces without using plasma or ion beam. Therefore, the surfaces can be treated without causing the surfaces to be damaged or contaminated, or without causing the temperature to rise. The apparatus realized according to the present invention can be employed very effectively for the process for producing semiconductor elements.

What is claimed is:

1. A surface treatment apparatus comprising:
   a vacuum chamber;
   gas introducing means for introducing a gas into said vacuum chamber;
   gas heating means for heating said gas and activating said gas to make active particles while the gas is being introduced, said gas heating means comprising a gas furnace and a heater for heating said gas furnace,
   gas injecting means for injecting said activated gas into said vacuum chamber to form a beam of said active particles; and
   substrate holding means installed in said vacuum chamber to hold a substrate of which a surface is to be treated in a position opposite to said gas injecting means, to allow said beam to impinge on said surface in a perpendicular direction to said surface.

2. A surface treatment apparatus according to claim 1, wherein said gas injecting means exists in said heater.

3. A surface treatment apparatus according to claim 1, wherein said gas injecting means includes apertures between a side facing said gas furnace and another side facing said substrate, said apertures being different at each side.

4. A surface treatment apparatus according to claim 1, wherein said gas furnace is provided with a bypass exhaust line.

5. A surface treatment apparatus according to claim 1, wherein said heater and said gas furnace are separable from each other.

6. A surface treatment apparatus according to claim 1, wherein said gas furnace is made of a material selected from any one of quartz, alumina, sapphire, carbon and nickel.

7. A surface treatment apparatus according to claim 1, wherein said gas that is introduced consists of at least one of halogen atoms or partly of halogen atoms in molecules.

8. A surface treatment apparatus according to claim 1, wherein said gas that is introduced consists of least one of oxygen or nitrogen.

9. A surface treatment apparatus according to claim 1, wherein a collimator is provided between said gas injecting means and said substrate for collimating said beam, said collimator having a plurality of holes which are parallel to an axis connecting said gas injecting means and said substrate.

10. A surface treatment apparatus according to claim 1, wherein a shielding plate is provided between said gas heating means and said substrate.

11. A surface treatment apparatus according to claim 1, wherein said heater is disposed outside said vacuum chamber.

12. A surface treatment apparatus according to claim 1, wherein said vacuum chamber is divided into two sections, said gas heating means is provided in a first section of said vacuum chamber and said substrate is placed in a second section of said vacuum chamber, and said sections of said vacuum chamber are differentially evacuated.

13. A surface treatment apparatus according to claim 1, wherein said vacuum chamber is divided into two sections, said gas heating means is provided in a first section of said vacuum chamber and said substrate is placed in a second section of said vacuum chamber, and a gate valve is provided between said first section of said vacuum chamber in which said gas heating means is provided and said second section of said vacuum chamber in which said substrate is placed.

14. A surface treatment apparatus according to claim 1, wherein an aperture of said gas injection means has side walls which define an opening with a cross-sectional area which increases in a direction toward said substrate.

15. A surface treatment apparatus according to claim 12, wherein said first and second sections of said vacuum chamber are connected by a bellows.

16. A surface treatment apparatus according to claim 1, wherein said gas furnace includes barrier walls.

17. A surface treatment apparatus according to claim 1, wherein said gas furnace includes a filler material.

* * * * *